(12) United States Patent
Kim et al.

(10) Patent No.: US 6,583,647 B2
(45) Date of Patent: Jun. 24, 2003

(54) SIGNAL CONVERTING SYSTEM HAVING LEVEL CONVERTER FOR USE IN HIGH SPEED SEMICONDUCTOR DEVICE AND METHOD THEREFOR

(75) Inventors: Nam-Seog Kim, Seoul (KR); Uk-Rae Cho, Suwon (KR); Kwang-Jin Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/055,206

(22) Filed: Jan. 23, 2002

(65) Prior Publication Data

US 2003/0067323 A1 Apr. 10, 2003

(30) Foreign Application Priority Data

Oct. 9, 2001 (KR) ........................................ 2001-62065

(51) Int. Cl.[7] ................... H03K 19/0175; H03K 19/01; H03K 3/017
(52) U.S. Cl. .......................... 326/81; 326/86; 326/17; 327/172
(58) Field of Search ...................... 326/81, 80, 82–83, 326/86–87, 17; 327/108, 172–176

(56) References Cited

U.S. PATENT DOCUMENTS

| 5,089,726 A | * | 2/1992 | Chappell et al. ............ 327/50 |
| 5,343,090 A | * | 8/1994 | Proebsting .................. 326/21 |
| 6,175,248 B1 | * | 1/2001 | Mack ........................... 326/63 |

FOREIGN PATENT DOCUMENTS

JP 01186011 A * 7/1989 ............ H03K/3/03

* cited by examiner

*Primary Examiner*—Michael Tokar
*Assistant Examiner*—James H Cho
(74) *Attorney, Agent, or Firm*—F. Chau & Associates, LLP

(57) ABSTRACT

A level converting apparatus for converting an original voltage level to a wanted voltage level is disclosed. The level converter includes a converting part for outputting a level-converting signal having a different level from that of an input signal in response to an input signal; a delay part for delaying the level-converted signal of the converting part by a predetermined time; and a self-reset part for generating a reset signal in response to the delayed level-converted signal of the delay part to output it to the converting part so that a pulse width of the level-converted signal as output is set as much as the sum of a predetermined delay time and an internal operation delay time.

12 Claims, 10 Drawing Sheets

SIGNAL CONVERTING SYSTEM HAVING LEVEL CONVERTER FOR USE IN HIGH SPEED SEMICONDUCTOR DEVICE AND METHOD THEREFOR

BACKGROUND OF THE INVENTION

1. Field of the Invention

The invention relates to a level converter apparatus for converting an original voltage level to a wanted voltage level and, more particularly, to a signal converting system having a level converter for high-speed semiconductor devices and a signal converting method therefor.

2. Description of the Related Art

With the reduction in design rules for semiconductor memory devices, voltage levels in semiconductor chips have been greatly reduced. Interface voltage levels, however, which are determined for interfaces between the internal circuitry of a chip and an external circuit, have not been significantly reduced for reasons of signal transfer characteristics and interface efficiency.

Referring to FIG. 1, an internal voltage of a chip tends to be determined at lower levels than the corresponding interface voltage. The graphed line G1 illustrates interface voltage levels and G2 indicates internal voltage levels. The transverse axis indicates design rules and vertical axis indicates voltage levels. Comparing the graphs G1 and G2 indicates that the internal voltage levels are lower than the interface voltage levels when the design rules are in the range of point t1 and below as design rules are reduced. Accordingly, in the case where an internal voltage level is lower than an interface voltage level, a level converter for increasing a voltage level of an output signal needs to be employed in a semiconductor device in order to output an internal signal of chip to an external circuit.

Referring to FIG. 2, there is shown a typical voltage level converter, which is used as a data output buffer. This level converter includes PMOS transistor pair P1, P2 in which gate terminals each are cross-coupled to the other's corresponding drain terminals, NMOS transistors N1, N2 having their drain terminals connected to the drain terminals of the PMOS transistor pair P1, P2 and wherein their gate terminals receive an input signal DIN and an inverted input signal, a first inverter I1 for receiving a first power voltage VDD as an operational power voltage and inverting a level of the input signal DIN, and a second inverter I2 for receiving a second power voltage vddq as an operational power voltage and connected to a drain terminal of the PMOS transistor P2 to thereby invert a signal level of an output node NO2. The level of the first power voltage VDD at DIN is lower than that of the second power voltage vddq and corresponds to an internal voltage level. The level of the second power voltage vddq corresponds to the interface voltage level. The level converter operates as follows in order to convert an input signal having an internal voltage level to an output signal having an interface voltage level.

When the input signal DIN is input as a CMOS logic level "high", the NMOS transistor N1 is turned on and the other NMOS transistor N2 is turned off. Accordingly, the PMOS transistor P1 is turned off and a gate voltage of the PMOS transistor P2 decreases to 0V, and the PMOS transistor P2 is turned on. As a result, the node NO2 goes to logical "high" by being affected by a level of the second power voltage vddq. The "high" level of the node NO2 is inverted by the second inverter I2 and output as a "low" level at the output terminal DOUT. The "low" level at the output terminal DOUT is approximately 0V.

When the input signal DIN is input as a logic "low", the NMOS transistor N1 is turned off and another NMOS transistor N2 is turned on. Accordingly, the PMOS transistor P1 is turned on and the gate voltage of the PMOS transistor P2 rises up to a level of the second power voltage vddq, thereby the PMOS transistor P2 is turned off. As a result, the voltage level of the node NO2 goes "low". The "low" level of the node NO2 is inverted by the second inverter I2 and output as a "high" level at the output terminal DOUT. The "low" level at the output terminal DOUT is equal to the interface voltage level. In such a process, an input signal having an amplitude of 0V/VDD is converted to an output signal having an amplitude of vddq/0V.

However, there is a problem. Because the level converter shown in FIG. 2 has converter characteristics as graphed in FIG. 3, it is difficult to apply such a level converter to a semiconductor device having high speed operations. FIG. 3 shows waveforms of input/output signals, the time D that it takes to create the output signal DOUT after the input signal DIN is applied is too long for high speed operations. The delayed time D is caused by the operational characteristics of such static circuits. Such a static circuit requires an overlap time that is caused by the fighting of pull down and pull up currents when a signal is shifted. Such an overlap time causes delay in its operation and deteriorates high-speed responses accordingly. In addition, as shown in FIG. 3, although the pulse duty ratio of the input signal is 50%, the "low" region T1 and the "high" region T2 are different from one another, which is caused by characteristic of differential amplification type of level converter. The reason is that when a signal is shifted from "low" to "high" and a signal is shifted from "high" to "low", their response characteristics differ from one another. Hence, the period of time that it takes the level converter in FIG. 2 to convert levels is relatively long and there is accordingly a problem that the duty ratio of an output signal is different from that of an input signal.

The U.S. Pat. No. 6,175,248 to Michael P. Mack, which is issued on Jan. 16, 2001, discloses a logic level converter. The Mack patent is directed to a pulse width distortion correction logic level converter for converting a small swing differential logic signal into full swing complementary CMOS signal while preserving the pulse width of the original signal. The converter includes a receiver circuit for receiving the differential input signal and a converter circuit for converting the differential input signal to first and second output signals and comprising a latch device for latching the first and second output signals to output a single-ended signal having a same pulse width as the differential input signal.

However, the level converter as described in the Mack patent has the disadvantage that, because the converter performs setting and resetting a latch by using first and second output signals (e.g., long pulses having long delay) of the first and second converters receiving a common differential input signal, it takes a long time in a level-converting operation. The reason is that the first and second converters each have delay times of T1 and T2 relative to a rising signal and a falling signal, and the latch receives only a rising signal from the first and second converters to thereby perform set and reset operations. Accordingly, there is a disadvantage that because performance of a chip may be lowered when the above-conventional level converter is employed in a semiconductor device, a conventional level converter is not appropriate for a semiconductor device that requires a high-speed response in its operation.

SUMMARY OF THE INVENTION

An object of the invention is to provide a high-speed level converter for converting level in high speed.

Another object of the invention is to provide a level converter minimizing a decrease in performance of a chip.

Another object of the invention is to provide a signal converting apparatus by which the period of time being spent in level converting is minimized and a duty ratio of a level-converted signal becomes identical to a duty ratio of an input signal.

Another object of the invention is to provide a signal converting apparatus and a signal level converting method thereof for outputting a single ended signal having the same pulse width as that of an input signal.

Another object of the invention is to provide a level converter and a level converting method that is appropriate for a high-speed semiconductor device requiring a high-speed response characteristic.

Another object of the invention is to provide a signal converting apparatus and a signal converting method thereof which are appropriate for a high-speed semiconductor memory device requiring a high-speed response characteristic and generates a level-converted output signal having the same pulse width as that of a differential input signal.

According to an aspect of the invention to accomplish the above-objects, a level converter comprises a converting part for outputting a level-converting signal having a different level from that of an input signal in response to an input signal, a delay part for delaying the level converting signal of the converting part by a predetermined time, and a self-reset part for generating a reset signal in response to the delayed level converting signal of the delay part to output it to the converting part so that a pulse width of the level converting signal as output is set as much as the sum of the predetermined delay time and an internal operation delay time.

According to an aspect of the invention, a signal converting apparatus for converting a first input signal and a second input signal that are input as differential input signals comprises a first converter for converting the first input signal to output it, a second converter for converting the second input signal to output it, and a latch part for outputting a single ended signal having the same pulse width as that of the differential input signal in response to the first and second converting signals.

According to an aspect of the invention, a level-converting method comprises the steps of outputting a level converting signal having a different level from that of an input signal in response to an input signal, delaying the level converting signal by a predetermined delay time, and generating a reset signal in response to the delayed level converting signal and controlling the level converting signal by the reset signal so that a pulse width of the level converting signal as output is set as much as the sum of the predetermined delay time and an internal operational delay time.

According to an aspect of the invention, a signal converting method that is appropriate for a semiconductor device, comprises the steps of receiving through each separate paths a first input signal and a second input signal that are input as differential input signals, separately generating pulse types of first and second converting signals in response to each shifts of the first and second input signals, and outputting a single ended signal as an output signal having a pulse width corresponding to pulse widths of the first and second input signals in response to the first and second converting signals.

BRIEF DESCRIPTION OF THE DRAWINGS

The advantages of the invention will become apparent by describing in detail preferred embodiments thereof with reference to the attached drawings in which.

DETAILED DESCRIPTION OF PREFERRED EMBODIMENTS

Figure 1:
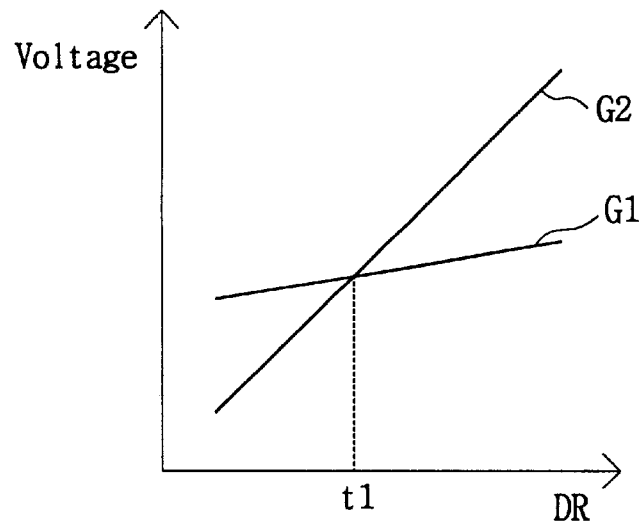
FIG. 1 is a graph for illustrating a decreasing trend in an internal voltage level of a semiconductor device.
Figure 2:
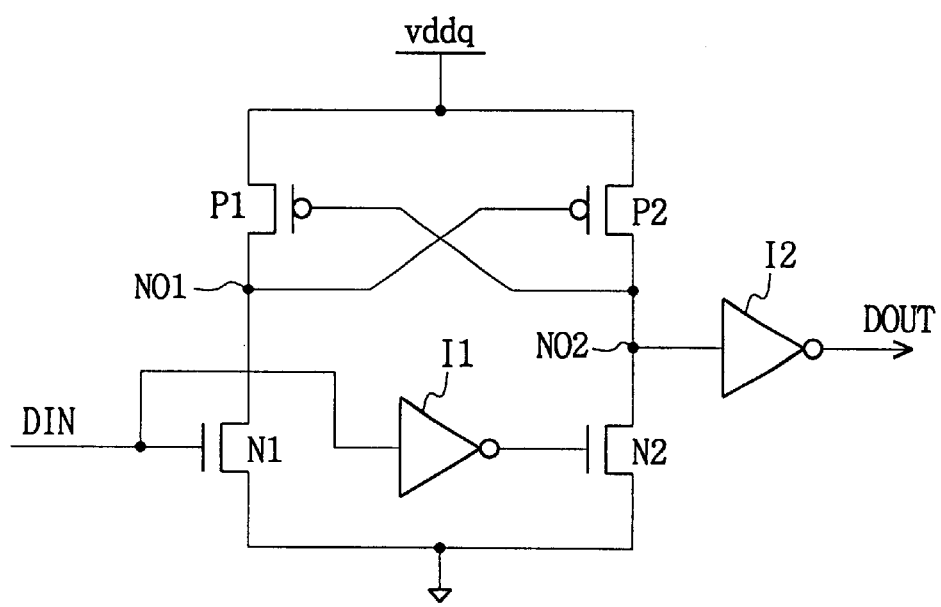
FIG. 2 is a circuit view of a common level converter.

Hereinafter, the invention will be described in detail with reference to the accompanying drawings of FIGS. 4 through 13. It should be noted that like reference numerals are used through the accompanying drawings for designation of like or equivalent parts or portion for simplicity of illustration and explanation. Also, in the following description, specifications will be made to provide a thorough understanding about the invention. It is apparent to one skilled in the art that the invention can be achieved without the specifications. There will be omission of detailed description about well-known functions and structures to clarify key points of the invention.

Figure 4:
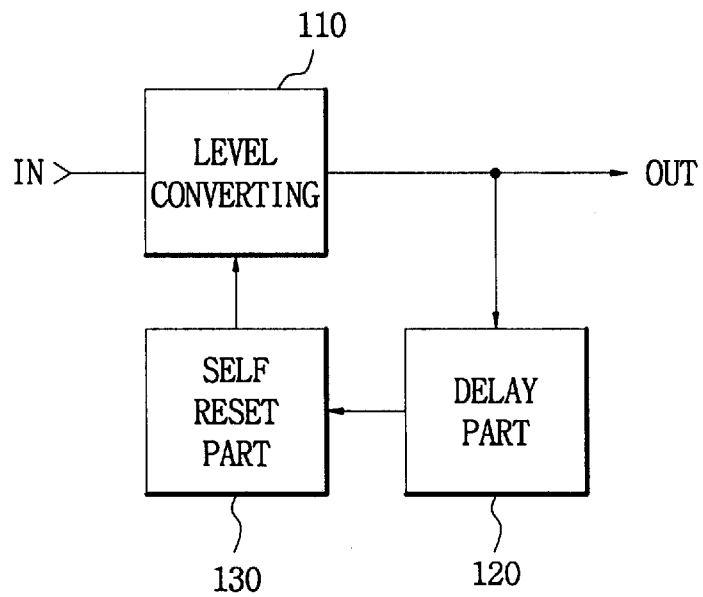
FIG. 4 is a block diagram of a level converter according to a preferred embodiment of the invention.

FIG. 4 is a block diagram of a level converter according to a preferred embodiment of the invention. The level converter includes a level converting part 110, a delay part 120, and a self-reset part 130. The level converting part 110 outputs a level-converted signal OUT having a different level from that of an input signal IN in response to shifts of the input signal IN, such as a rising edge, for example. The delay part 120 delays the level-converted signal OUT of the level converting part 110 by a predetermined delay. The self-reset part 130 generates a reset signal in response to the delayed level-converted signal of the delay part 120 and outputs it to the converting part 110 so that a pulse width of the level-converted signal as output is set as the sum of the predetermined delay and an internal operation delay. The internal operational delay is generated by an operation of the self-reset part 130.

Figure 5:
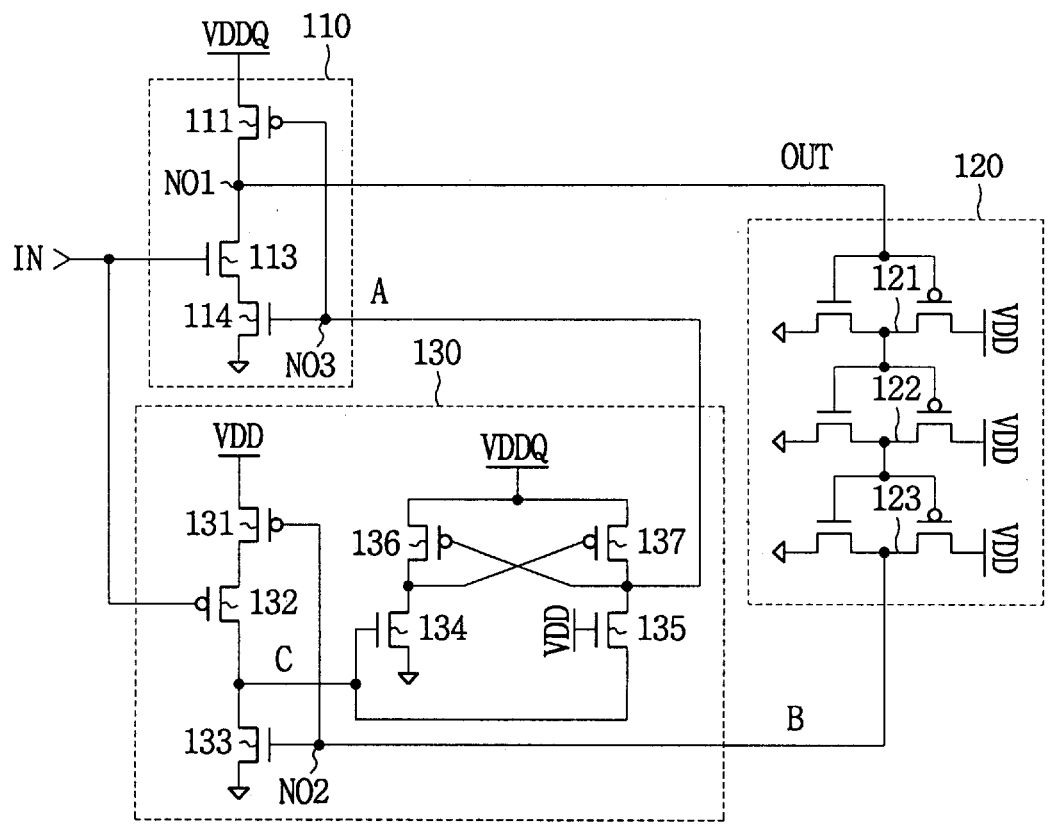
FIG. 5 is a detailed circuit view of the level converter shown in FIG. 4.

FIG. 5 is a detailed circuit diagram illustrating an embodiment of the level converter of FIG. 4. The level converting part 110 is a dynamic circuit having high-speed response characteristics superior to those of static circuits and functions to output a level-converted signal OUT having a different level from that of the input signal IN in response to shifts of the input signal. The level converting part 110 comprises a PMOS transistor 111 with its source connected to a second power voltage VDDQ, its drain connected to a node NO1, and its gate is connected to a reset node NO3. An NMOS transistor 113 has its drain is connected to node NO1 and its gate receives the input signal IN. Another NMOS transistor 114 has its drain is connected to a source of the NMOS transistor 113 and its gate is connected to the reset node NO3.

The delay part 120 comprises a plurality of inverters, such as an inverter 121 receiving and inverting the level-converted signal OUT and delaying it by a unit of delay, an inverter 122 inverting an output of the inverter 121 and delaying it by a unit of delay, and an inverter 123 inverting an output of the inverter 122 and delaying it by a unit of delay. The inverters 121–123 operate as a delay chain and delay the level-converting signal OUT by a predetermined delay. Because the delay part 120 comprises the odd number of inverters, its output signal B is the invert of the level-converted signal OUT.

The self reset part 130 comprises a PMOS transistor 131 having its source connected to a first power voltage VDD that is lower than the second power voltage VDDQ. A PMOS transistor 132 is provided having its source connected to a drain of the PMOS transistor 131 and its gate receiving the input signal IN. An NMOS transistor 133 has its drain connected to a drain of the PMOS transistor 132 and its gate receiving the signal B. PMOS transistors 136, 137 have their sources connected to the second power voltage VDDQ and their gates are cross-connected to their drains. An NMOS transistor 134 has its drain-source channel connected between ground and a drain of the PMOS transistor 136 and its gate connected to a drain of the NMOS transistor 133 and an NMOS transistor 135. The NMOS transistor 135 has its drain connected to a drain of the PMOS transistor 137, its gate receives the first power voltage VDD, and its source is also connected to the drain of the NMOS transistor 133.

Figure 6:
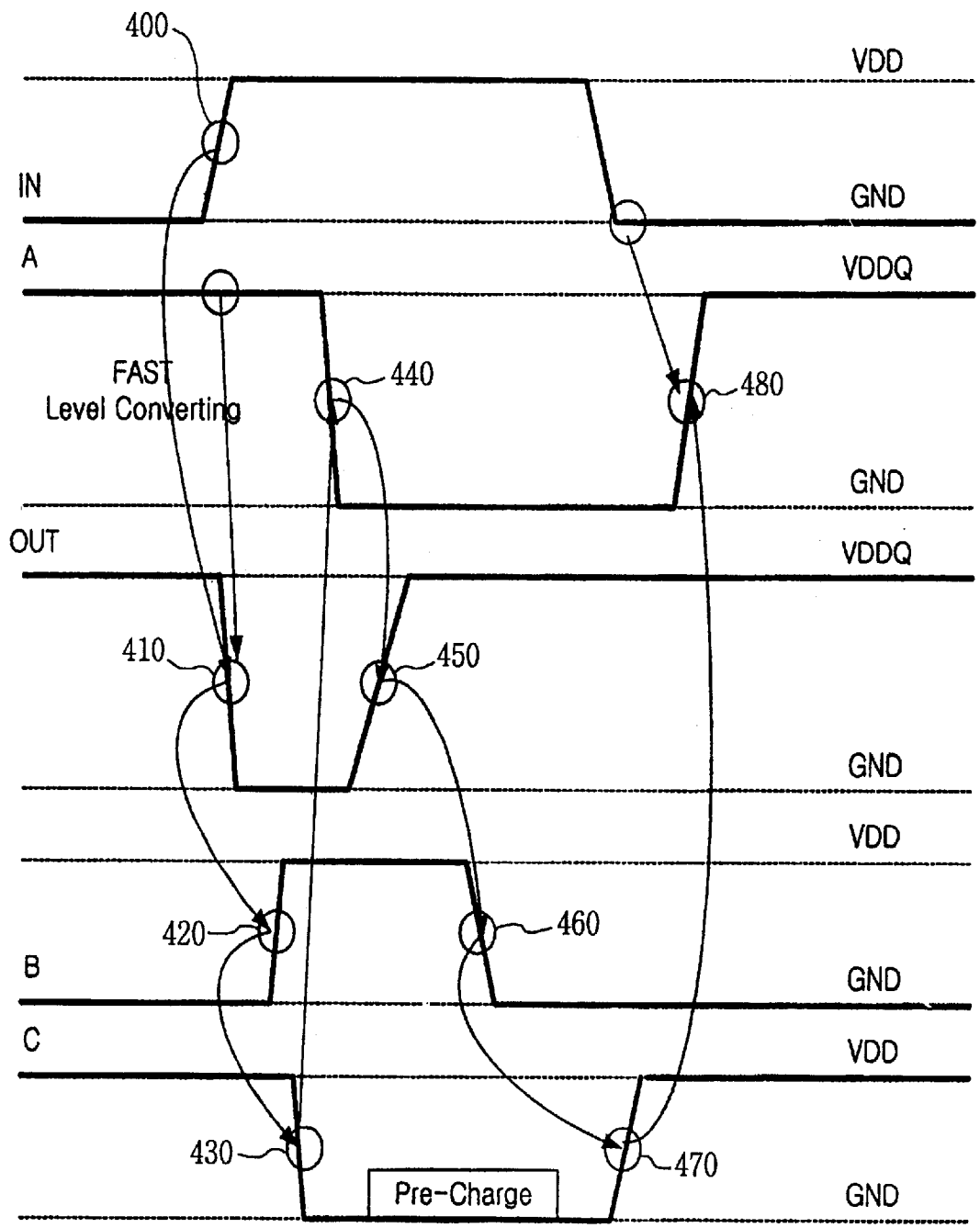
FIG. 6 is an operational timing view of the level converter of FIG. 5.

Referring to FIG. 6, it can be seen that the converter of the invention quickly converts voltage levels and has superior response characteristics than those of conventional converters. FIG. 6 illustrates an operational timing of the level converter shown in FIG. 5, the operation of which is explained as follows.

Referring to FIGS. 5 and 6, the pre-charge node NO1 and reset node NO3 each maintain a level of logical "high" at an early state, as shown in the waveform OUT and waveform A in FIG. 6. The "high" level corresponds to the second power voltage VDDQ. When the input signal IN is input as a waveform IN as shown in FIG. 6 at such an early state, the NMOS transistor 113 is turned on in response to a rising edge 400 of the signal IN. The pre-charge node NO1, representing the OUT signal, is shifted 410 to a low level as shown in the waveform of FIG. 6. The delay part 120 outputs a signal 420 of high level as shown in waveform B of FIG. 6 in response to the waveform OUT that is shifted to a low level. Waveform B is output after being delayed by a predetermined delay time and has a phase opposite to that of the level-converted signal OUT that now shifted to a low level. When NMOS transistor 133 in the self-reset part 130 is turned on in response to a high waveform B, waveform C that is output at the drain of the NMOS transistor 133 is shifted 430 to a low level. The NMOS transistor 135 is accordingly turned on and the PMOS transistor 136 is turned off, and thereby the reset signal A that appears at the reset node NO3 is shifted 440 to a low level as shown in waveform A. When the reset node NO3 is shifted to a low level, the PMOS transistor 111 in the level converting part 110 is turned on and raises node NO1 to a high level. As a result, the level-converted signal OUT goes high 450 and the level-converted signal OUT appears as a pulse-type signal.

When waveform OUT is shifted to a high level, the output B of the delay part B is shifted 460 to a low level and the PMOS transistor 132 is turned on, and thereby the waveform C that appears at the drain of the NMOS transistor 133 is shifted 470 to a high level as shown in the waveform C. Accordingly, because the NMOS transistor 134 and the PMOS transistor 137 are turned on and the NMOS transistor 135 and the PMOS transistor 136 are turned off, the reset signal A is shifted 480 to a high level as shown in the waveform A in FIG. 6. The pre-charge node NO1 as an output terminal of the waveform OUT is pre-charged by the second power voltage VDDQ while the reset node NO3 is maintained as a low level. As shown in FIG. 6, the low pulse width of the level-converting signal OUT is set as about the sum of the predetermined delay of the delay part 120 and the internal operational delay of the self reset part 130. In this way, because the delay time that is spent to convert an input signal from first power voltage VDD to the second power voltage VDDQ is only the delay that it takes while the NMOS transistor 113 is turned on, thus yielding high-speed response characteristics.

Figure 7:
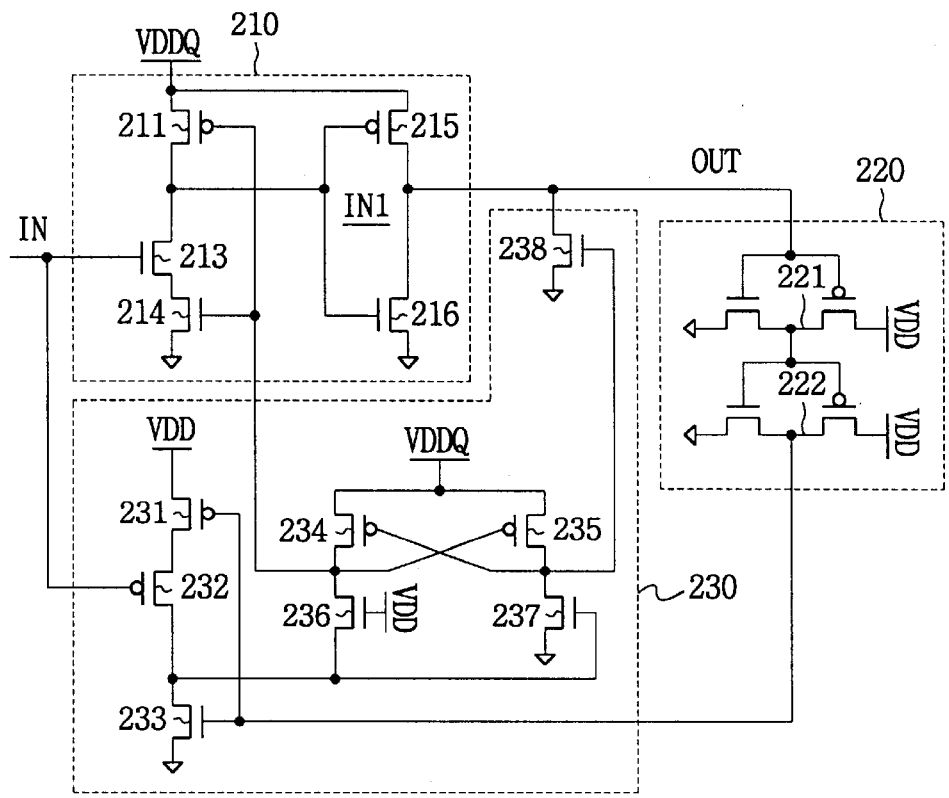
FIG. 7 is a detailed circuit view of another level converter of FIG. 4.

FIG. 7 is a detailed circuit view of another embodiment of the invention. The level converting part 210 comprises a PMOS transistor 211 with its source connected to a second power voltage VDDQ, an NMOS transistor 213 with its drain is connected to the drain of the transistor 211 and its gate receiving the input signal IN, and another NMOS transistor 214 with its drain connected to a source of the NMOS transistor 213. An inverter IN1 comprising PMOS and NMOS transistors 215, 216 is provided having its input terminal connected to a drain of the PMOS transistor 211. The gates of the PMOS and NMOS transistors 211, 214 are connected and operate as reset nodes for receiving a reset signal. A pre-charge node operates as a drain of the PMOS transistor 211.

The delay part 220 comprises a plurality of inverters, such as an inverter 221 receiving and inverting the level-converted signal OUT and delaying it by a unit of delay, an inverter 222 inverting an output of the inverter 221 and delaying it by a unit of delay. The inverters 221–222 operate as a delay chain and delay the level-converting signal OUT by a predetermined delay. Because the delay part 220 comprises an even number of inverters, its output signal is the same as the level-converting signal OUT, but delayed by a predetermined delay time.

The self reset part 230 comprises a PMOS transistor 231 with its source connected to the first power voltage VDD, which is at a lower voltage than the second power voltage VDDQ, a PMOS transistor 232 with its source connected to a drain of the PMOS transistor 231 and its gate receiving the input signal IN, an NMOS transistor 233 with its drain connected to a drain of the PMOS transistor 232 and its gate receiving an output of the delay part 220, PMOS transistors 234, 235 with their sources connected to the second power voltage VDDQ and their gates cross-connected to their drains, an NMOS transistor 237 with its drain-source channel connected between ground and a drain of the PMOS transistor 235 and its gate is connected to a drain of the NMOS transistor 233, an NMOS transistor 236 with its drain connected to a drain of the PMOS transistor 234, its gate receiving the first power voltage VDD and its source connected to a drain of the NMOS transistor 233, and an NMOS transistor 238 with its drain receiving an output of the level converting part 210, its gate is connected to a drain of the NMOS transistor 237, and its source connected to ground.

This embodiment also displays very high-speed characteristics. The operational timing of the device of FIG. 7 is identical to that shown in FIG. 6 except that the waveform of the level-converted signal OUT is inverted from that shown as waveform OUT in FIG. 6.

Figure 8:
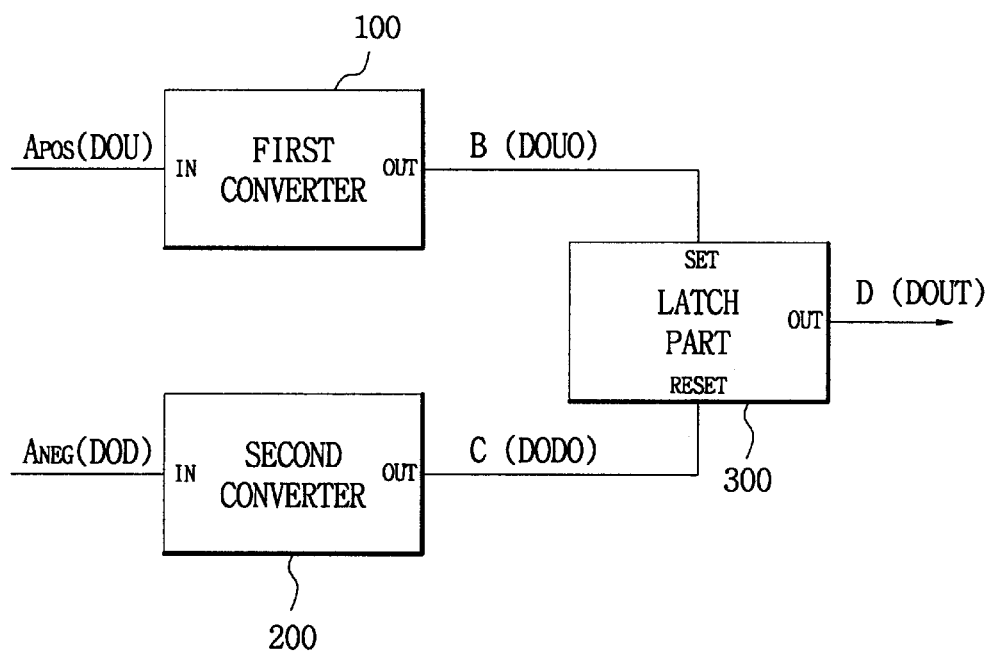
FIG. 8 is a block diagram of a signal converting system comprising the level converter of FIG. 4.
Figure 11:
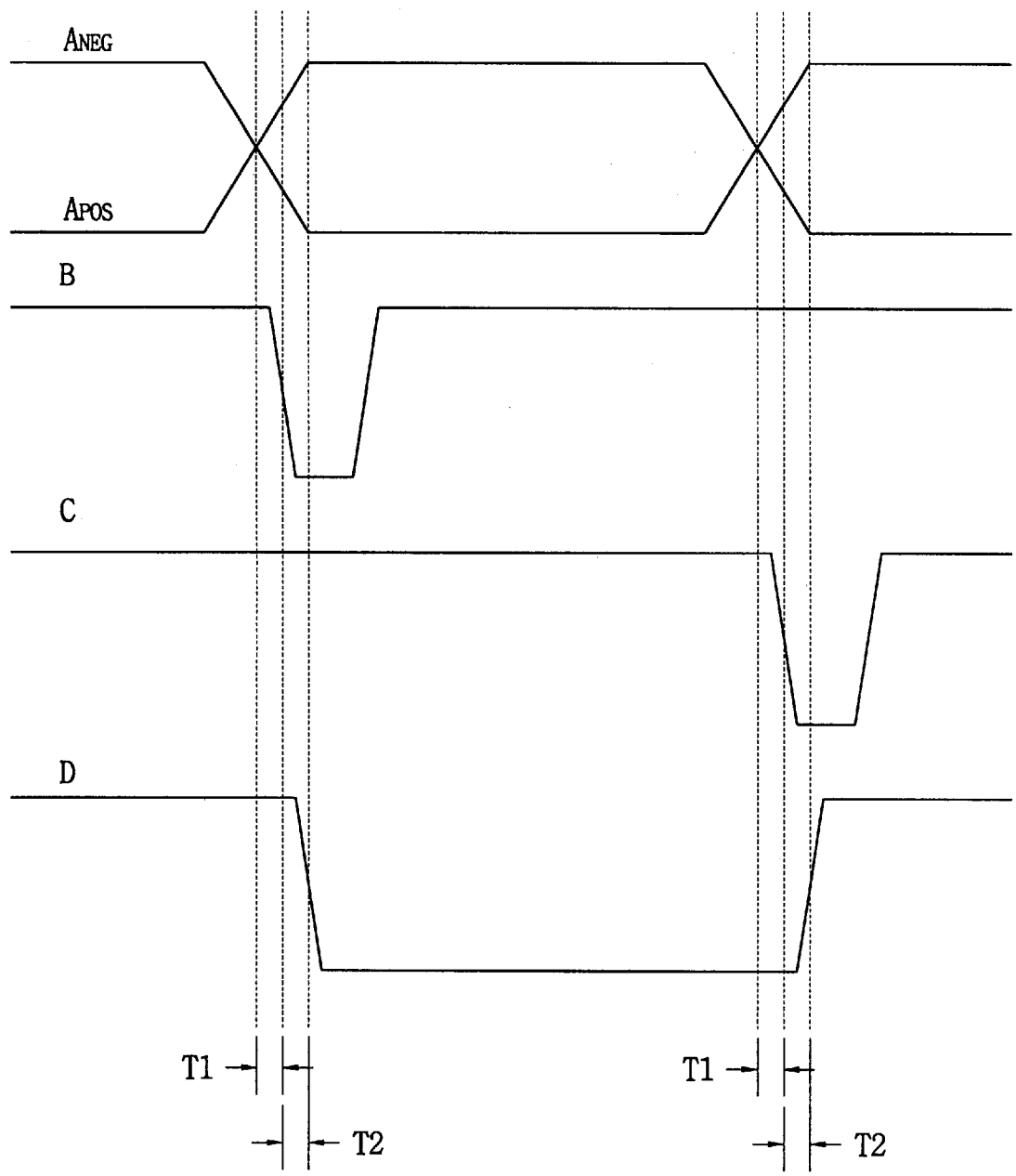
Figure 12:
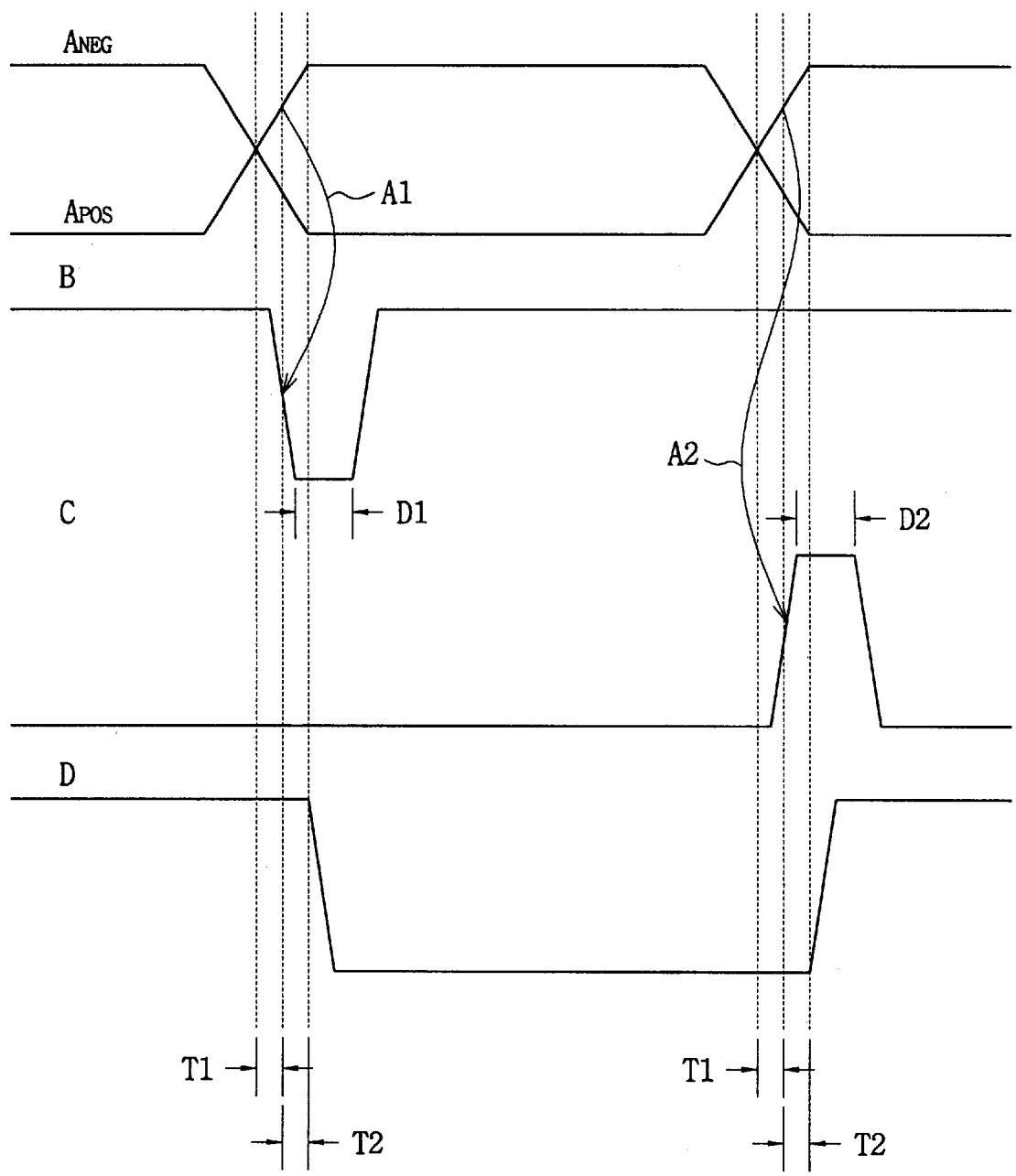

FIG. 8 is a block diagram of a signal converting apparatus constructed by using the level converter shown in FIG. 4 according to an embodiment of the invention. As shown in FIG. 8, the signal converting apparatus for converting the first and second input signals $A_{POS}$, $A_{NEG}$, which are received as differential input signals, comprises a first level converter 100 for converting the first input signal to generate a first converting signal B, a second level converter 200 for converting the second input signal to generate a second converting signal C, and a latch part 300 for outputting a single output signal D having the same pulse width as that of the differential input signal in response to the first and second converting signals B, C. The timing of the signal converting apparatus of FIG. 8 may be changed by changing the internal configuration of the first and second converters 100, 200, using one or both of the embodiments described with respect to FIGS. 5 and 7, thereby generating varied operational timings as shown in FIGS. 10, 11, 12.

Figure 10:
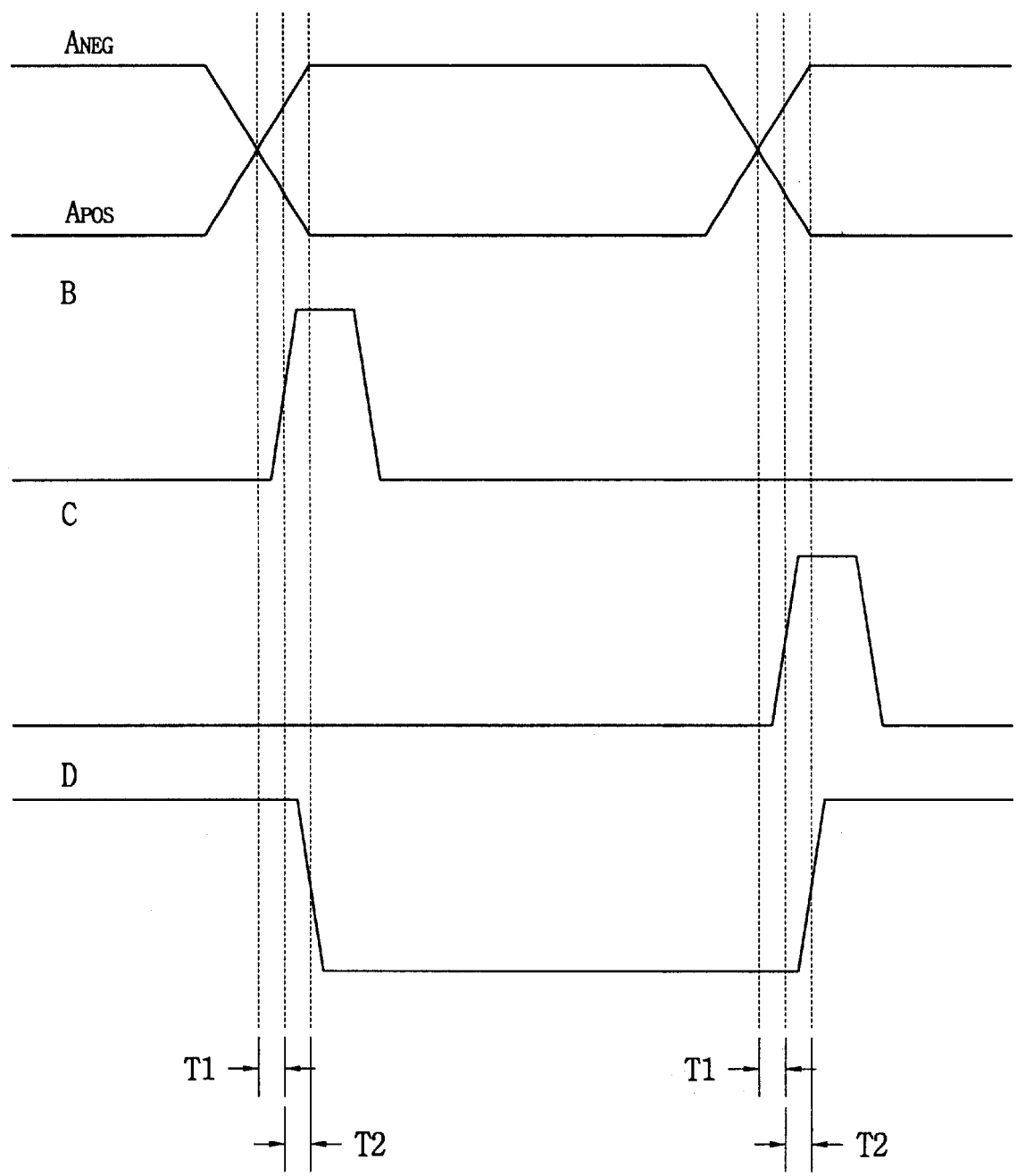
FIGS. 10 to 12 are operational timing views for illustrating various types of operations of the signal converting system of FIG. 8.

FIG. 10 shows the case where the first and second converters 100, 200 output all the first and second converting signals B, C as high pulses. FIG. 11 shows the case where the first and second converters 100, 200 output all the first and second converting signals B, C as low pulses. FIG. 12 shows the case where the first and second converters 100, 200 output the first and second converting signals B, C as a low pulse and a high pulse, respectively. FIGS. 10, 11, 12 indicate that the output signal D is output as a low signal having a pulse width identical to that of the differential input signal according to an operation of the latch part 300.

The signal converting apparatus is now explained with reference to FIG. 9 and its operation is explained with reference to the operational timing views of FIGS. 12 and 13.

Figure 9:
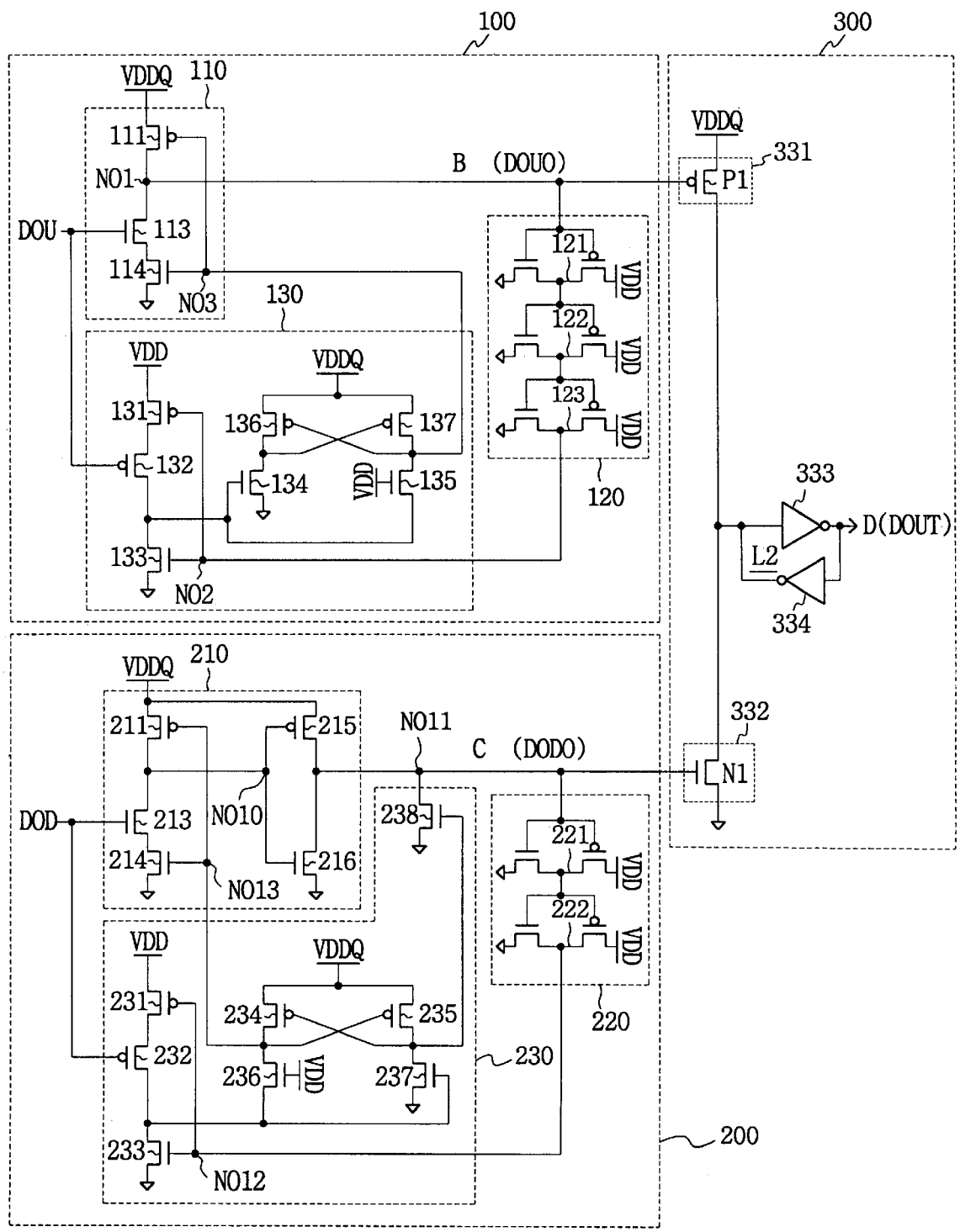
FIG. 9 is a detailed circuit view of the signal converting system of FIG. 8.

FIG. 9 is a detailed circuit view of an embodiment signal converting apparatus as shown in FIG. 8. The signal converting apparatus comprises a first converter 100, a second converter 200, and a latch part 300. Here, we have chosen the first converter 100 to have the same structure as in FIG. 5, and the second converter 200 to have the same structure as in FIG. 7. The latch part 300 comprises PMOS and NMOS transistors 331, 332 that operate as pull up and pull down transistors, and an inverter latch L2 comprising inverters 333, 334. The circuit shown in FIG. 9 may be employed as an output buffer in a semiconductor device requiring high-speed response. The input signal of the first converter 100 is designated as DOU, and the input signal of the second converter 200 is designated as DOS. The input signals DOU and DOD operate as differential input signals.

Referring to FIGS. 9 and 12, when the input signal DOU is input as the waveform Apos, the first converter 100 outputs the first converting signal B (also indicated as DOUO in FIG. 9) in response to a rising edge of the waveform Apos. Extension and reduction in the pulse width D1 of the first converting signal B can be determined by controlling the number of inverters that are included in the delay part 120. The detailed operation of the first converter 100 is the same as in FIGS. 5 and 6. The PMOS transistor 331 in the latch part 300 is turned on when the waveform B goes low. Accordingly, the second power voltage VDDQ is input as a high level to an input terminal of the inverter 333 that is a component of latch L2. The inverter 333 outputs a low signal to the output terminal, which is indicated as DOUT, as shown in waveform D of FIG. 12. The signal remains at a low level by the latch operation of the latch L2 even though the PMOS transistor 331 is turned off when waveform B goes high. The latch L2 may be assumed to have a high level at an early state for purposes of illustration. As described above, in the case where the latch L2 is set so as to output a low signal, the latch remains so set until reset by a turn-on operation of the NMOS transistor N1. Waveform D is shifted to a low level as soon as waveform Apos goes high, and hence the output signal responds at high-speed to the rising edge of an input signal.

In the case where the input signal DOD is input as waveform Aneg of FIG. 12, the second converter 200 outputs the second converting signal C in response to a rising edge of waveform Aneg, which is indicated by reference symbol A2. The detailed operation of the second converter 200 is same as previously described.

The NMOS transistor 332 in the latch part 300 is turned on when waveform C shifts to a high level. The input terminal of the inverter 333 of latch L2 accordingly goes low, thereby resetting the latch L2. The output terminal that is indicated as DOUT outputs a high signal by operation of the inverter 333, as shown in waveform D of FIG. 12. The high signal is held by latch L2 even though NMOS transistor 332 may be turned off. As described above, in the case where latch L2 is reset to output a high signal, the signal remains latched until the PMOS transistor 331 is turned on. Referring to waveform D in FIG. 12, the output signal DOUT has the same pulse width as that of the differential input signal DOU, DOD, and the entire delay time T1+T2 spent in level converting is minimized, thereby yielding high-speed response characteristics.

Figure 3:
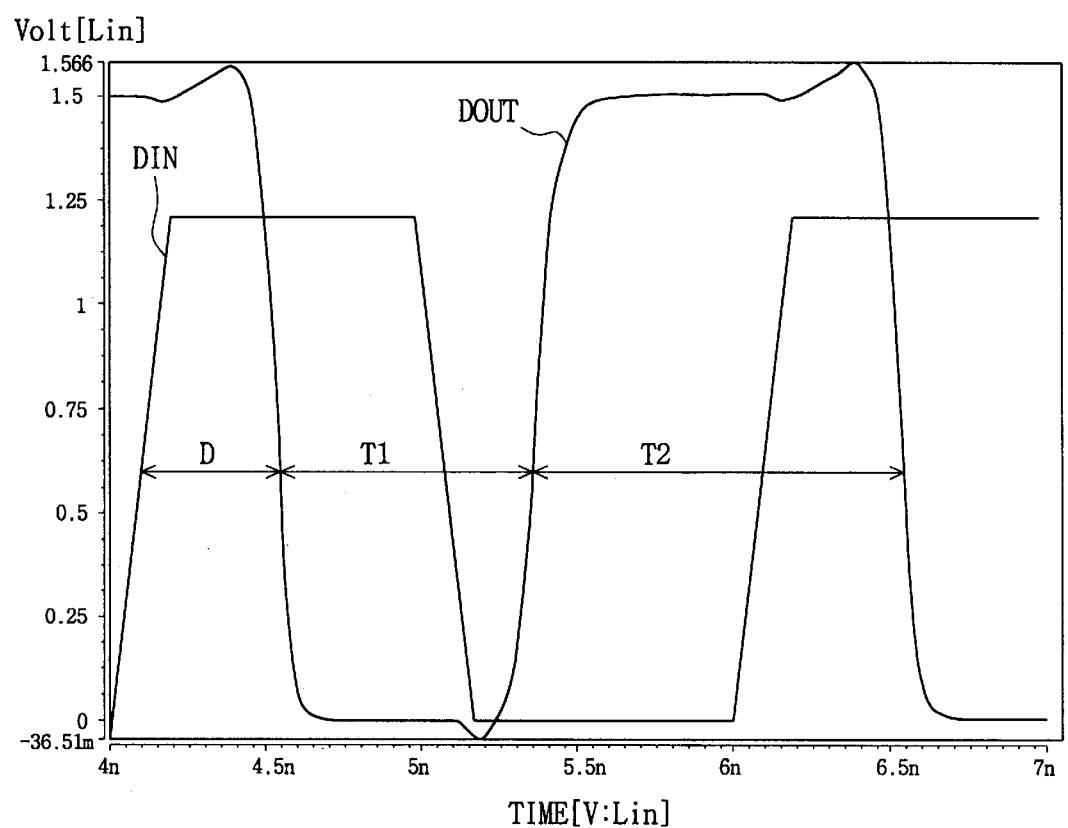
FIG. 3 is a timing view of input/output signals in view of FIG. 2.
Figure 13:
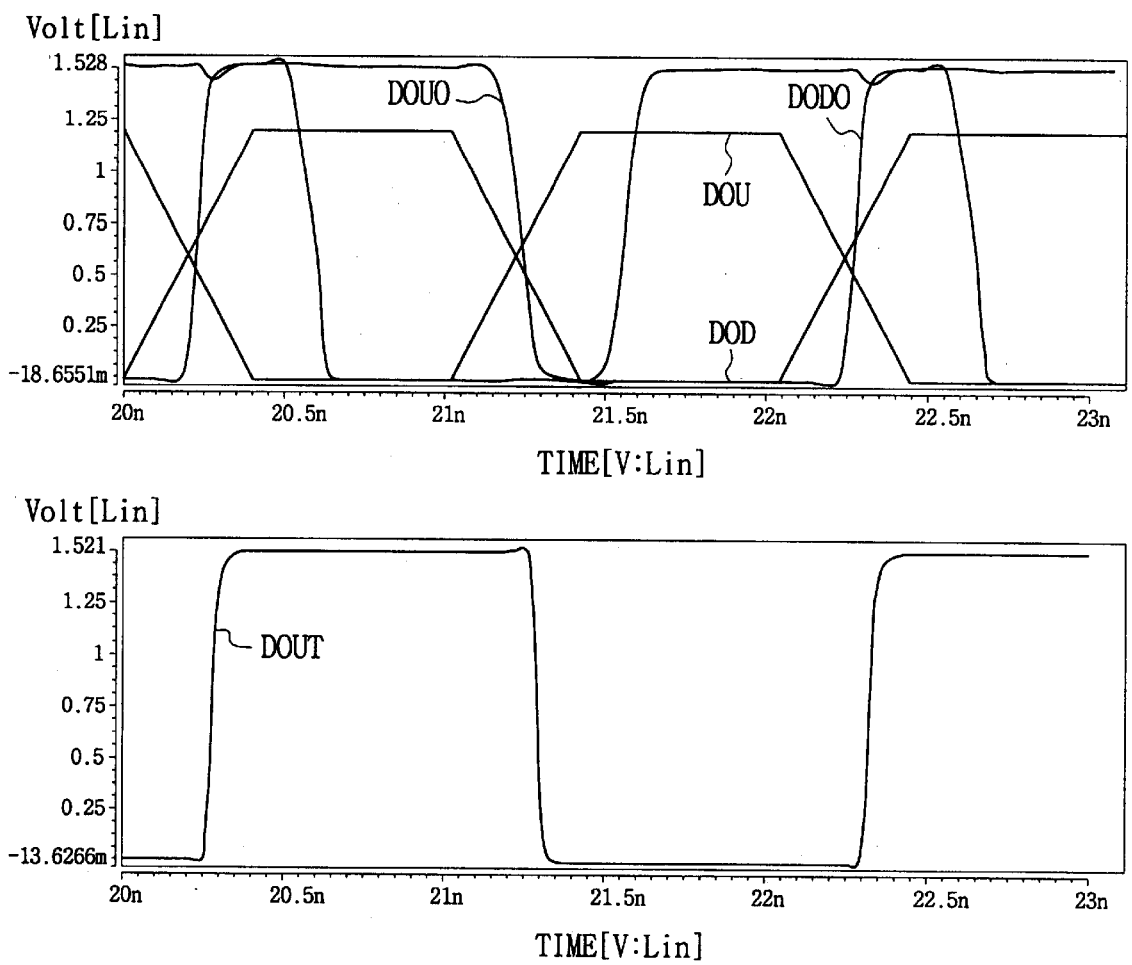
FIG. 13 is waveform views showing operational timing simulation of the signal converting system of FIG. 9.

FIG. 13 shows simulation waveforms for illustrating an operational timing according to FIG. 9. FIG. 13 indicates that a low pulse of DOUO is generated at a rising edge of DOU, and a high pulse of DODO is created at a rising edge of DOD. A final signal DOUT is obtained earlier than at the output point shown in FIG. 3 and the duty ratio is maintained without any changes.

Advantageously, according to preferred embodiments of the invention, the time that it takes to convert a signal level is minimized and the duty ratio of an output signal is the same as that of an input signal, thereby minimizing a decrease in performance of a chip.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A level converter comprising:
   a converting part for outputting a level-converted signal having a different level from that of an input signal in response to the input signal;

a delay part for delaying the level-converted signal of the converting part by a predetermined time; and a self-reset part for generating a reset signal in response to the delayed level-converted signal of the delay part to output it to the converting part so that a pulse width of the level-converted signal as output is set as much as the sum of the predetermined delay time and an internal operation delay time.

2. The level converter of claim 1, wherein the level-converting signal has a shorter pulse width than that of the input signal.

3. The level converting of claim 1, wherein the level-converted signal has a higher level than that of the input signal.

4. A level converter comprising:

a converting part having a pre-charge node and a reset node to output through the pre-charge node a level-converting signal having a different level from a level of an input signal in response to the input signal;

a delay part for delaying the level-converted signal of the converting part by a predetermined time; and a self-reset part for generating a reset signal in response to the delayed level-converted signal of the delay part to output it to the reset node of the converting part so that a pulse width of the level-converted signal as output is set as much as the sum of the predetermined delay time and an internal operation delay time and the pre-charge node is pre-charged.

5. The level converter of claim 4, wherein the level converting part comprises:

a PMOS transistor with its source connected to a second power voltage, its drain connected to a node and its gate connected to the reset node;

a first NMOS transistor with its drain connected to the node and its gate receiving the input signal; and a second NMOS transistor with its drain connected to a source of the first NMOS transistor and its gate connected to the reset node.

6. The level converter of claim 5, wherein the delay part comprises the odd number of inverters receiving the level-converted signal to delay by the predetermined delay time.

7. The level converter of claim 6, wherein the self reset part comprises:

a first self reset PMOS transistor with its source connected to a first power voltage that is lower than the second power voltage;

a second self reset PMOS transistor with its source connected to a drain of the first self reset PMOS transistor and its gate receiving the input signal;

a first self reset NMOS transistor having its drain connected to a drain of the second self reset PMOS transistor and its gate receiving an output signal of the delay part;

third and fourth self reset PMOS transistors having their sources connected to the second power voltage and their gates cross-connected to their drains;

a second self reset NMOS transistor with its drain-source channel connected between ground and a drain of the first self reset PMOS transistor and its gate connected to a drain of the first self reset NMOS transistor; and a third self reset NMOS transistor with its drain connected to a drain of the fourth self reset PMOS transistor, its gate receives the first power voltage and its source is connected to a drain of the first self reset NMOS transistor.

8. A level converter comprising:

a converting part having a pre-charge node and a reset node to output through an output node a level-converting signal having a different level from a level of an input signal in response to the input signal;

a delay part for receiving through the output node and delaying the level-converted signal of the converting part by a predetermined time; and a self-reset part for generating a reset signal in response to the delayed level-converted signal of the delay part to output it to the reset node of the converting part so that a pulse width of the level-converted signal as being output through the output node is set as much as the sum of the predetermined delay time and an internal operation delay time and the pre-charge node is pre-charged.

9. The level converter of claim 8, wherein the level converting part comprises:

a PMOS transistor with its source connected to a second power voltage, its drain connected to the pre-charge node and its gate connected to the reset node;

a first NMOS transistor with its drain connected to the pre-charge node and its gate receiving the input signal;

a second NMOS transistor with its drain connected to a source of the first NMOS transistor and its gate connected to the reset node; and an inverter connected between the pre-charge node and output node.

10. The level converter of claim 9, wherein the delay part comprises an even number of inverters.

11. The level converter of claim 10, wherein the self reset part comprises:

a first self reset PMOS transistor with its source connected to a first power voltage that is lower than the second power voltage;

a second self reset PMOS transistor with its source connected to a drain of the first self reset PMOS transistor and its gate receiving the input signal;

a first self reset NMOS transistor with its drain connected to a drain of the second self reset PMOS transistor and its gate receiving an output signal of the delay part;

third and fourth self reset PMOS transistors in which their sources are connected to the second power voltage and their gates are cross-connected to their drains;

a second self reset NMOS transistor having its drain-source channel connected between ground and a drain of the fourth self reset PMOS transistor and its gate connected to a drain of the first self reset NMOS transistor;

a third self reset NMOS transistor having its drain connected to the reset node connected to the drain of the third self reset PMOS transistor, its gate receiving the first power voltage and its source connected to the drain of the first self reset NMOS transistor; and, a fourth self reset NMOS transistor having its gate connected to the drain of the fourth self reset PMOS transistor and its channel running from ground to the output node.

12. A level-converting method comprises the steps of:

outputting a level-converted signal having a different level from that of an input signal in response to shift of an input signal;

delaying the level-converted signal by a predetermined delay time; and generating a reset signal in response to the delayed level-converted signal and controlling the level-converted signal by the reset signal so that a pulse width of the level-converted signal as output is set as much as the sum of the predetermined delay time and an internal operational delay time.

* * * * *